United States Patent

Mach et al.

[11] Patent Number: 5,812,376
[45] Date of Patent: Sep. 22, 1998

[54] MOUNTING ASSEMBLY FOR ELECTRICAL COMPONENTS AND HEAT SINKS

[75] Inventors: Terry P. Mach, Madison; Kurt R. Jackson; Alfred H. Glover, both of Decatur; Chandrakant Dave, Huntsville; Frank Hodges, Scottsboro; Stephen L. Morris, Somerville, all of Ala.

[73] Assignee: Chrysler Corporation, Auburn Hills, Mich.

[21] Appl. No.: 845,099

[22] Filed: Apr. 21, 1997

[51] Int. Cl.⁶ ........................................................ H05K 7/20
[52] U.S. Cl. ........................... 361/719; 257/727; 361/704
[58] Field of Search .................................. 257/706, 707, 257/726, 727; 361/704, 707, 709–712, 717–719; 174/16.3; 165/80.3, 185; 267/150, 158, 160; 24/453, 457, 458, 570, 573.1, 625, 598.1; 248/316.7, 505, 507, 517

[56] References Cited

U.S. PATENT DOCUMENTS

| | | | |
|---|---|---|---|
| 4,575,038 | 3/1986 | Moore | 361/717 |
| 4,605,986 | 8/1986 | Bentz | 361/717 |
| 4,707,726 | 11/1987 | Tinder | 361/717 |
| 4,710,852 | 12/1987 | Keen | 361/717 |
| 5,057,909 | 10/1991 | Mok et al. | 357/81 |
| 5,155,661 | 10/1992 | Nagesh et al. | 361/386 |
| 5,184,211 | 2/1993 | Fox | 257/706 |
| 5,191,512 | 3/1993 | Ogura et al. | 361/386 |
| 5,258,887 | 11/1993 | Fortune | 361/720 |
| 5,280,409 | 1/1994 | Selna et al. | 361/720 |
| 5,305,185 | 4/1994 | Samarov et al. | 361/704 |
| 5,375,652 | 12/1994 | Matsunaga et al. | 165/80.3 |
| 5,402,006 | 3/1995 | O'Donley | 257/796 |
| 5,404,273 | 4/1995 | Akagawa | 361/707 |
| 5,430,611 | 7/1995 | Patel et al. | 361/705 |
| 5,461,542 | 10/1995 | Kosak et al. | 361/710 |
| 5,463,250 | 10/1995 | Nguyen et al. | 257/698 |
| 5,467,251 | 11/1995 | Katchmar | 361/719 |
| 5,470,795 | 11/1995 | Shushurin | 437/208 |

*Primary Examiner*—Gerald P. Tolin

[57] ABSTRACT

A mounting assembly mounts an integrated circuit between a printed circuit board and a lower surface of a heat sink. The mounting assembly includes a plurality of electrical leads extending out from the integrated circuit and toward the printed circuit board. The electrical leads extend in a direction away from the lower surface of the heat sink. A spring is secured to the heat sink and disposed adjacent the printed circuit board and facing the integrated circuit to abut the lower surface of the heat sink such that thermal energy will pass from the integrated circuit to the heat sink.

11 Claims, 1 Drawing Sheet

MOUNTING ASSEMBLY FOR ELECTRICAL COMPONENTS AND HEAT SINKS

BACKGROUND OF THE INVENTION

1. Field of the Invention

The invention relates to mounting assemblies for mounting a printed circuit board and an integrated circuit to a heat sink. More particularly, the invention relates to a mounting assembly for mounting electrical components to a heat sink with reduced noise from the mounting thereof in a motor vehicle environment.

2. Description of the Related Art

The mounting of electrical components becomes more of a concern as the sophistication of those electrical components grows. One environment where this is particularly important is in audio systems in vehicles. The vehicular environment is very hostile in that temperature swings, and shaking and rattling motions make it difficult for electrical components to operate noiselessly. In the audio system, this becomes troublesome when the clarity of the audio system is distorted due to the effects of the hostile environment.

One such mounting assembly is disclosed in U.S. Pat. No. 5,258,887, issued to Fortune on Nov. 2, 1993. In this disclosure, a printed circuit board having a plurality of heat conductive layers embedded the rein is secured to a heat sink via an electrical insulator. The printed circuit board is secured to the heat sink using a mechanical fastener, a screw in the embodiment disclosed therein. This assembly is deficient in that the erratic motion and thermal swings experienced by a printed circuit board in the vehicular environment will prevent the screw from maintaining the printed circuit board adjacent the heat sink. Further, the variances in the amount of force applied to the printed circuit board by the screw will vary the performance of those components found on the printed circuit board. Another disadvantage associated with the embodiment disclosed in U.S. Pat. No. 5,258,887 is the inability to stack components due to the requirement of accessing the fastener, i.e., the screw.

SUMMARY OF THE INVENTION

Accordingly, a mounting assembly is disclosed for mounting an integrated circuit between a printed circuit board and a lower surface of a heat sink. The mounting assembly includes a plurality of electrical leads extending out from the integrated circuit and toward the printed circuit board. The plurality of electrical leads extend in a direction away from the lower surface of the heat sink. A spring is secured to the heat sink and is disposed adjacent the printed circuit board. The spring forces the integrated circuit to abut the lower surface of the heat sink such that thermal energy will pass from the integrated circuit to the heat sink.

One advantage associated with the invention is the ability to mount an integrated circuit between a printed circuit board and the lower surface of a heat sink. Another advantage associated with the invention is the ability to mount an integrated circuit in an environment having severe thermal changes and erratic vibrations. Still another advantage associated with the invention is the ability to mount an integrated circuit to a printed circuit board and a heat sink and maintain the quality output from the integrated circuit set forth by the design parameters. Yet another advantage associated with the invention is the ability to stack integrated circuits and printed circuit boards with little difficulty.

BRIEF DESCRIPTION OF THE DRAWINGS

Other advantages of the invention will be readily appreciated as the same becomes better understood by reference to the following detailed description when considered in connection with the accompanying drawings, wherein.

DETAILED DESCRIPTION OF THE PREFERRED EMBODIMENT(S)

Figure 1:
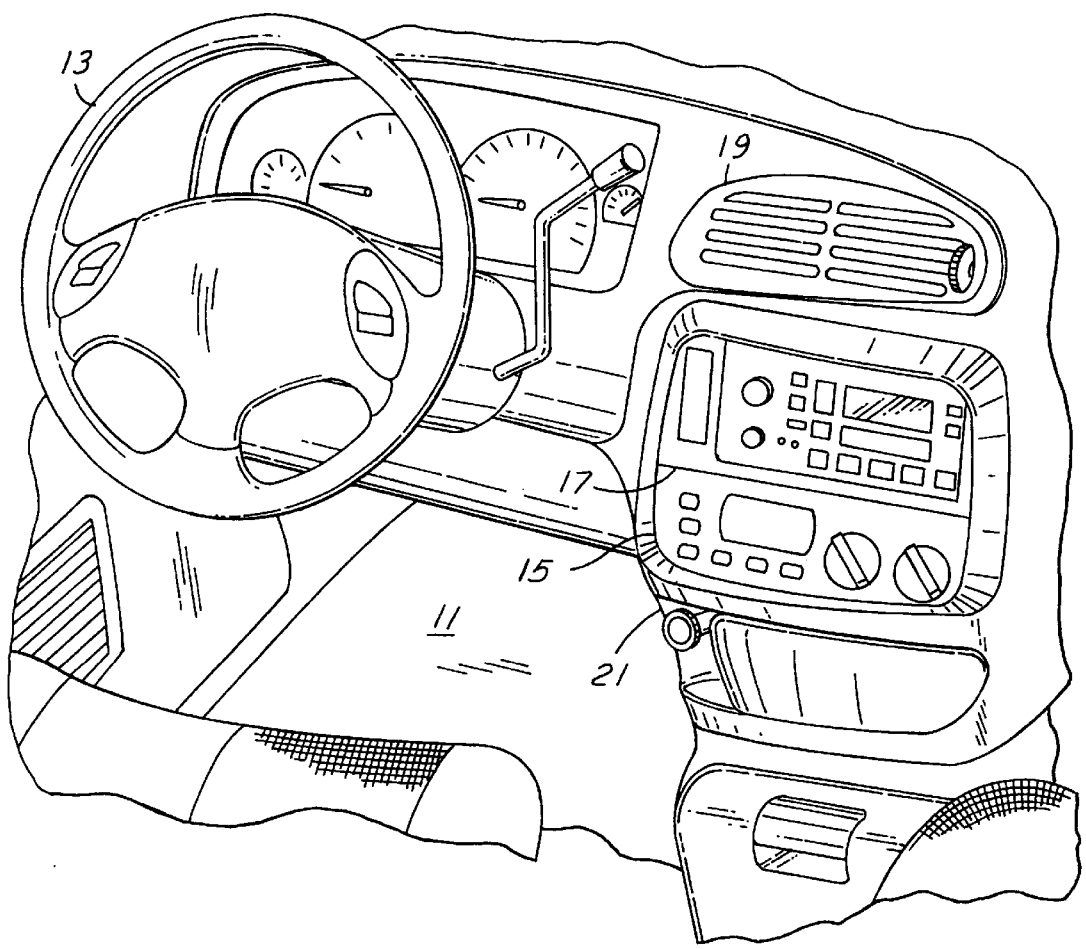
FIG. 1 is a perspective view, partially cut away, of a passenger compartment of a motor vehicle including an audio system.

Referring to FIG. 1, a perspective view partially cut away of a passenger compartment 11 of a motor vehicle (not shown) includes a steering wheel 13 and instrument console 15. The instrument console 15 includes, among other things, the control or radio of an audio system 17. Although climate controlled using climate control vents 19, temperature fluctuations inside the passenger compartment are great, especially when the motor vehicle is unattended. In addition, the audio system 17 receives vibrations, shakes, and rattles, which are transmitted thereto through the console 21 and the rest of the motor vehicle.

Figure 2:
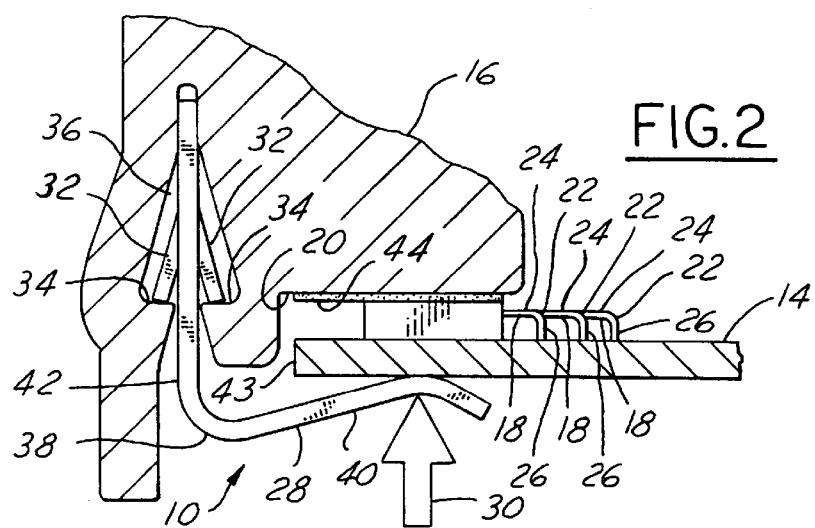
FIG. 2 is a side view of one embodiment of the invention.

Referring to FIG. 2, a mounting assembly is generally indicated at 10. The mounting assembly 10 mounts an integrated circuit 12 between a printed circuit board 14 and a heat sink 16. The heat sink 16 is shown partially cut away. The mounting assembly 10 includes a plurality of electrical leads 18 which extend out from the integrated circuit 12 and toward the printed circuit board 14. Each of the plurality of electrical leads 18 extend in a direction away from a lower surface 20 of the heat sink 16.

Each of the plurality of electrical leads 18 include a bend 22. The bend 22 defines a 90 degree angle. Each of the plurality of electrical leads 18 has a first leg 24 and a second leg 26 separated by the bend 22.

A spring 28 is secured to the heat sink 16 and is disposed adjacent the printed circuit board 14. The spring 28 forces the integrated circuit 12 to abut the lower surface 20 of the heat sink 16 such that thermal energy will pass from the integrated circuit 12 to the heat sink 16. The force exerted by the spring 28 is represented by arrow 30. The force 30 is a predetermined force and it is exerted against the printed circuit board 14 in a direction against the lower surface 20 of the heat sink 16.

The spring 28 includes at least one retaining tang 32. In the embodiments shown in FIG. 2, the spring 28 includes two retaining tangs 32. The retaining tangs 32 secure the spring 28 to the heat sink 16. The retaining tangs 32 abut tang surfaces 34 found in a spring recess 36 of the heat sink 16. The spring 28 includes a spring bend 38 separating a first spring leg 40 and a second spring leg 42. The second spring leg 42 extends from a position spaced from an edge 43 of the printed circuit board up into the heat sink 16 generally parallel to the surface of the edge 43.

In the embodiment shown in FIGS. 1 and 2, the mounting assembly 10 includes a heat slug 44 which extends between the integrated circuit 12 and the heat sink 16. The heat slug 44 enhances the thermal transfer between the integrated circuit 12 and the heat sink 16. Typically, the heat slug 44 is fabricated from silver or other such malleable, conductive material. The heat slug 44 extends beyond the top surface 46 of the integrated circuit 12.

The invention has been described in an illustrative manner. It is to be understood that the terminology which has been used is intended to be in the nature of words of description rather than of limitation.

Many modifications and variations of the invention are possible in light of the above teachings. Therefore, within the scope of the appended claims, the invention may be practiced other than as specifically described.

We claim:

1. A mounting assembly mounting an integrated circuit between a printed circuit board and a lower surface of a heat sink, said mounting assembly comprising:

a plurality of electrical leads extending out from the integrated circuit and contacting the printed circuit board, said plurality of electrical leads extending in a direction away from the lower surface of the heat sink; and a spring secured to the heat sink and disposed adjacent the printed circuit board, said spring facing the integrated circuit and abutting the lower surface of the heat sink such that thermal energy will pass from the integrated circuit to the heat sink.

2. A mounting assembly as set forth in claim 1 including a heat slug disposed between and abutting the lower surface of the heat sink and the integrated circuit.

3. A mounting assembly as set forth in claim 2 wherein said spring includes retaining tangs to secure said spring to the heat sink.

4. A mounting assembly as set forth in claim 3 wherein said each of said plurality of electrical leads include a bend defining a first leg and a second leg.

5. A mounting assembly as set forth in claim 4 wherein said bend defines a ninety degree angle.

6. A mounting assembly as set forth in claim 2 wherein said spring asserts a predetermined force on the printed circuit board to maintain contact between the integrated circuit, the heat slug, and the heat sink.

7. A mounting assembly as set forth in claim 6 wherein said spring defines a spring bend separating a first spring leg and a second spring leg.

8. A mounting assembly mounting an integrated circuit between a printed circuit board and a lower surface of a heat sink comprising:

a plurality of electrical leads extending out from the integrated circuit and contacting the printed circuit board, said plurality of electrical leads extending in a direction away from the lower surface of the heat sink;

a spring secured to the heat sink and disposed adjacent the printed circuit board, said spring facing the integrated circuit and abutting the lower surface of the heat sink such that thermal energy will pass from the integrated circuit to the heat sink;

a heat slug disposed between and abutting the lower surface of the heat sink and the integrated circuit; and a spring including retaining tangs to secure said spring to the heat sink, said spring defining a spring bend separating a first spring leg and a second spring leg.

9. A mounting assembly as set forth in claim 8 wherein said spring asserts a predetermined force on the printed circuit board to maintain contact between the integrated circuit, the heat slug, and the heat sink.

10. A mounting assembly as set forth in claim 9 wherein each of said plurality of electrical leads include a bend defining a first leg and a second leg.

11. A mounting assembly as set forth in claim 8 wherein said second spring leg asserts a predetermined force against said printed circuit board in a direction against said lower surface of said heat sink.

* * * * *